United States Patent
Pan

(10) Patent No.: US 6,588,095 B2
(45) Date of Patent: Jul. 8, 2003

(54) METHOD OF PROCESSING A DEVICE BY ELECTROPHORESIS COATING

(75) Inventor: Alfred I-Tsung Pan, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/844,377

(22) Filed: Apr. 27, 2001

(65) Prior Publication Data

US 2002/0157856 A1 Oct. 31, 2002

(51) Int. Cl.[7] .............................. H05B 3/06; H05K 3/30; B21D 53/76
(52) U.S. Cl. .......................... 29/611; 29/890.1; 29/841; 29/855; 204/492; 204/493; 204/499; 204/500; 347/57; 347/58
(58) Field of Search ................. 29/611, 890.1, 29/841, 858, 846, 855; 204/492, 493, 499, 500; 347/57, 58, 59; 427/101; 174/94 R

(56) References Cited

U.S. PATENT DOCUMENTS

| | | | | |
|---|---|---|---|---|
| 4,208,261 A | * | 6/1980 | Todoroki et al. | 204/499 X |
| 4,321,290 A | | 3/1982 | Thams | |
| 5,116,472 A | * | 5/1992 | Wolter et al. | 204/499 X |
| 5,830,340 A | * | 11/1998 | Iljitch et al. | 204/500 X |
| 6,033,547 A | * | 3/2000 | Trau et al. | 204/492 X |

FOREIGN PATENT DOCUMENTS

| | | | |
|---|---|---|---|
| EP | 0092321 A1 | 10/1983 | |
| EP | 0593175 A2 | 4/1994 | |
| JP | 63301591 | 8/1988 | |
| JP | 2-4892 | * 1/1990 | 204/499 X |
| JP | 02267992 | 1/1990 | |
| JP | 05021680 | 1/1993 | |

* cited by examiner

Primary Examiner—A. Dexter Tugbang

(57) ABSTRACT

A method, and structure formed thereof, for processing an exposed conductive connection between an thermal inkjet head device and a flexible tape circuit connectable to control signals for driving the inkjet device. According to the method of processing, the exposed conductive connection is electrophoretically plated with a polymer to protect it against corrosive damage by coupling the exposed conductive connection to a first voltage potential and immersing it into an electrophoretic polymer solution in contact with an electrode at a second voltage potential thereby establishing a current between the electrode and the exposed connection such that the exposed connection is coated with a thin film of polymer of uniform thickness.

11 Claims, 3 Drawing Sheets

METHOD OF PROCESSING A DEVICE BY ELECTROPHORESIS COATING

FIELD OF THE INVENTION

The present invention relates to the protection of conductive surfaces in electrical circuits and, in particular, to the protection of conductive surfaces in a thermal inkjet print head circuit.

BACKGROUND OF THE INVENTION

Generally, an inkjet image is formed when a precise pattern of dots is ejected from a drop generating device known as a "print head" onto a printing medium. The typical inkjet print head has an array of precisely formed nozzles in an orifice plate that is attached to an ink barrier layer on a thermal inkjet print head substrate. FIG. 1 shows a print head substrate 12 with a single nozzle 10A formed in an orifice plate 10. The substrate incorporates an array of firing chambers that receive liquid ink from an ink reservoir. Referring to FIG. 1, each chamber 11 has a thin-film resistor 13, known as a "firing resistor", located opposite each nozzle 10A so ink can collect between the firing resistor and the nozzle. When electric printing pulses heat the thermal inkjet firing resistor, a small volume of ink adjacent the firing resistor is heated, vaporizing a bubble of ink, and thereby ejecting a drop of ink from the print head. The droplets strike the printing medium and then dry to form "dots" that, when viewed together, form the printed image.

Control signals for causing the resistors to "fire" originate from the printers processing unit. An electrical connection is established with the thin film resistor 13 by lithographically patterned conductive traces (not shown) connected between the resistor and an exposed bonding pad 14 remotely located from the resistor. The bonding pad facilitates connection with an exposed conductive lead on a flexible tape circuit 15 (also referred to as a flex circuit) that is carried on the print head. The flex circuit conveys control or "firing" signals from the printer's processor to the resistor.

The flex circuit is particularly suited for connecting electrical components where one or both connections may be coupled to moving parts. For example, in the case of an inkjet printer, the print head, which is scanned across the print media while ejecting droplets of ink, is electrically connected to the printer's processor with a flex circuit. In general, flex circuits are fine, conductive filaments or formed traces laminated between, overmolded with, or otherwise adhered to, a layer of a flexible, dielectric material, such as a polyimide tape. The interconnect circuit so formed can be bent or looped without affecting the electrical interconnections between the electrical components it connects.

A connection between a given firing resistor 13 and a conductive trace on the flex circuit 15 is created by attaching a conductive bonding beam 16 from the bonding pad 14 to the trace. After bonding, exposed conductive connection areas including at least the bonding pads, bonding beams and conductive traces on the flex circuit are protected/covered from the corrosive environment of the print head.

A previous approach for protecting the exposed conductive connection uses two different coating techniques to accommodate the surface characteristics of two distinct areas of the exposed connection. Specifically, since a first area including the bonding pad 14 and the bonding beam 16 is characterized by small crevices and irregularly shaped surfaces, this area is protected by dispensing a drop of protective coating 17 (including the pad and beam) thereby filling-in small crevices that are hard to coat and covering the entire area. On the other hand, a second area including the exposed conductive traces on the flex circuit 15 is characteristically planer. Consequently, this area is more adapted to a process in which the protective coating is laminated over the exposed traces using, for instance, a screen coating, or sheet/curtain process, thereby forming a protective layer of lamination 18 over the area.

One disadvantage of this coating technique is that due to the irregularity of the surface of the first area, the dispensed coating may have small unprotected pin holes or bubbles and may be unevenly distributed—resulting in unreliable protection of this area. In addition, covering the first and second areas using different processing techniques results in additional processing steps. Moreover, gaps of protection can occur between the dispensed protective coating 17 and the laminated coating 18.

What would be desirable is a reliable method of protecting the exposed connection areas between a print head and a flex circuit or, in general, between a device and a flex circuit using a single coating process.

SUMMARY OF THE INVENTION

A method of processing and a structure formed thereof. The method is performed on an exposed conductive connection area between a first device and a flexible tape circuit by coupling the exposed connection to a first voltage and immersing the exposed connection in an electrophoretic solution in contact with an electrode at a second voltage potential thereby establishing a current between the electrode and the exposed connection such that the exposed connection is coated with a thin insulating film of uniform thickness by electrophoretic plating.

In a second embodiment of the method of processing and a structure formed thereof, the method is performed on an exposed conductive connection between a thermal inkjet device and a flexible tape circuit connectable to control signals for driving the thermal inkjet device. The method is performed by coupling the exposed connection to a first voltage and immersing the exposed connection in an electrophoretic solution in contact with an electrode at a second voltage potential thereby establishing a current between the electrode and the exposed connection such that the exposed connection is coated with a thin insulating film of uniform thickness by electrophoretic plating.

BRIEF DESCRIPTION OF THE DRAWINGS

The objects, features, and advantages of the present invention will be apparent to one skilled in the art, in view of the following detailed description in which.

DETAILED DESCRIPTION OF THE INVENTION

A method, and structure formed thereof, for processing a first device, and in particular, a print head device, having an exposed electrically conductive connection to a flexible tape circuit in order to protect the electrical connection from exposure to a corrosive environment. According to the method, the exposed connection is coated with a protective material that resists the deleterious effects presented by the corrosive environment. For instance, in the environment occurring within an inkjet printer in the vicinity of the print head, components and connections are constantly exposed to moisture in the form of inks. This moisture will corrode the exposed connections when left unprotected.

Figure 1:
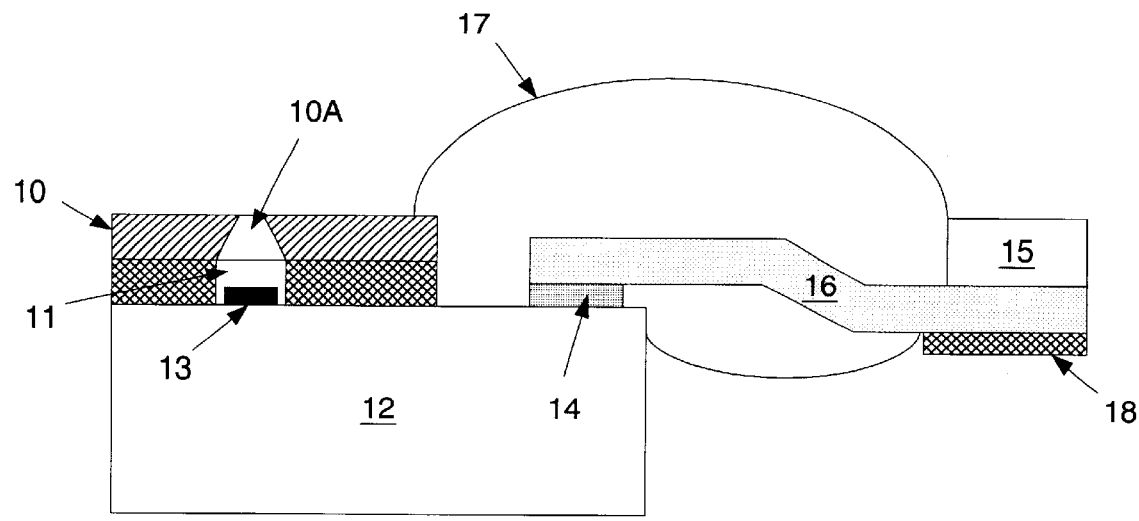
FIG. 1 illustrates a prior art thermal inkjet print head structure and protective coating covering exposed conductive connection areas as applied according to a prior art method.
Figure 2:
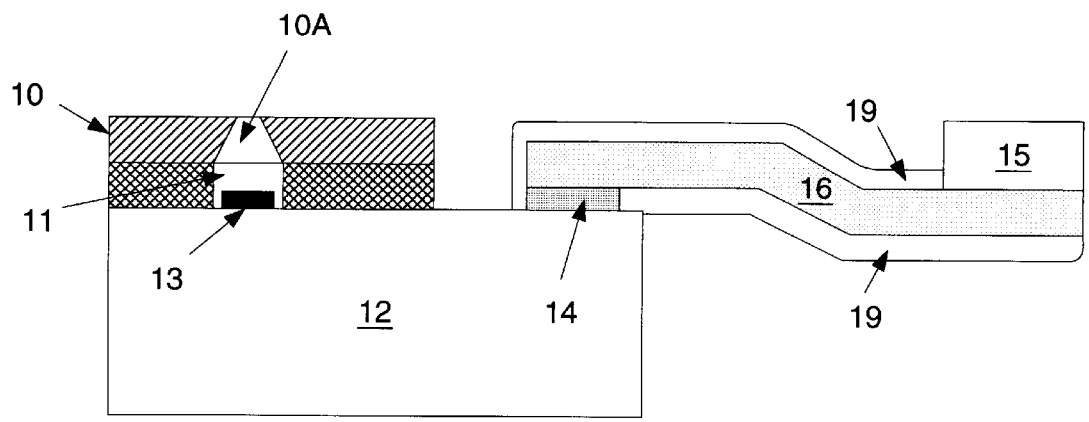
FIG. 2 illustrates a thermal inkjet print head structure and protective coating covering exposed conductive connection areas as applied according to the method of the present invention.

In general, according to the method, a structure is formed in which an exposed connection between the bonding pad on a print head substrate and a conductive trace on a flexible circuit is plated with a protective film using electrophoresis so as to evenly coat all exposed connection areas using a single coating technique. FIG. 2 shows one embodiment of a structure formed using the method of the present invention which includes a print head substrate 12 and an orifice plate 10 formed thereon, having at least a single orifice 10A. Formed beneath the orifice 10A is an ink chamber 11 including a heating element 13 electrically in connection (not shown) with a bonding pad 14. The bonding pad 14 is bonded by a conductive bonding beam 16 to a conductive trace (not shown) on a flexible tap circuit 15. A conductive connection is formed by the bonding pad 14, bonding beam 16, and conductive trace (not shown) on a flexible tape circuit 15. All exposed areas of the connection are plated with a polymer using electrophoresis so as to form a thin film 19 of uniform thickness on the exposed areas.

Figure 3A:
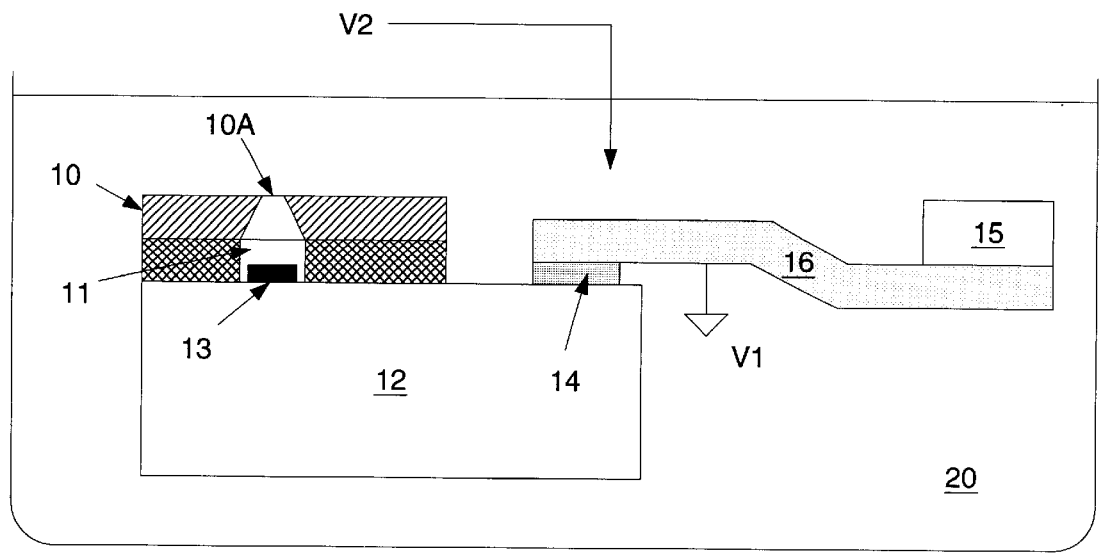
FIG. 3A illustrates one manner in which to electrophoretically plate an inkjet print head device.
Figure 3B:
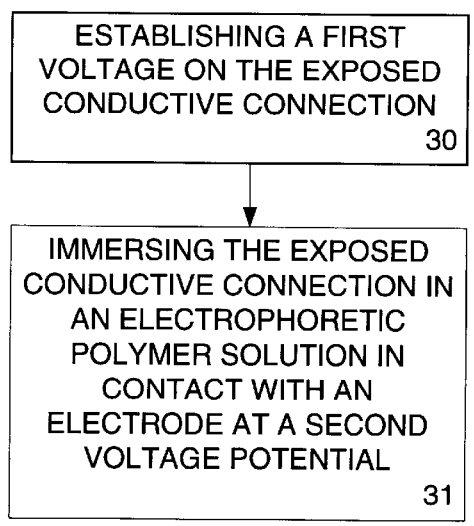
FIG. 3B illustrates a flow chart showing one embodiment of a method of electrophoretically plating an exposed connection.

FIGS. 3A and 3B illustrate one embodiment of the method of processing a thermal inkjet print head device having an exposed electrically conductive connection to a flexible tape circuit according to the present invention. It should be understood that the diagram shown in FIG. 3A is representation of the electrophoretic plating process and is not indicative of actual processing materials and equipment used for performing electrophoretic plating. FIG. 3A shows an exposed conductive connection including exposed bonding pad 14, bonding beam 16, and a conductive trace (not shown) on flex circuit 15. According to FIGS. 3A and 3B, the exposed connection is established at a first voltage $V_1$ (block 30). The exposed connection is immersed in an electrophoretic solution 20 in contact with an electrode at a second voltage potential $V_2$ (block 31), where $V_1 \neq V_2$, so as to establish a current between the electrode and the exposed connection such that the exposed connection is coated with a thin film of uniform thickness by electrophoretic plating. It should be understood that the establishing of the exposed connection to a voltage, $V_1$, can comprise coupling the connection to a given voltage supply, $V_1$, or may comprise leaving the exposed connection uncoupled such that $V_1$ is equal to a ground potential.

Figure 4:
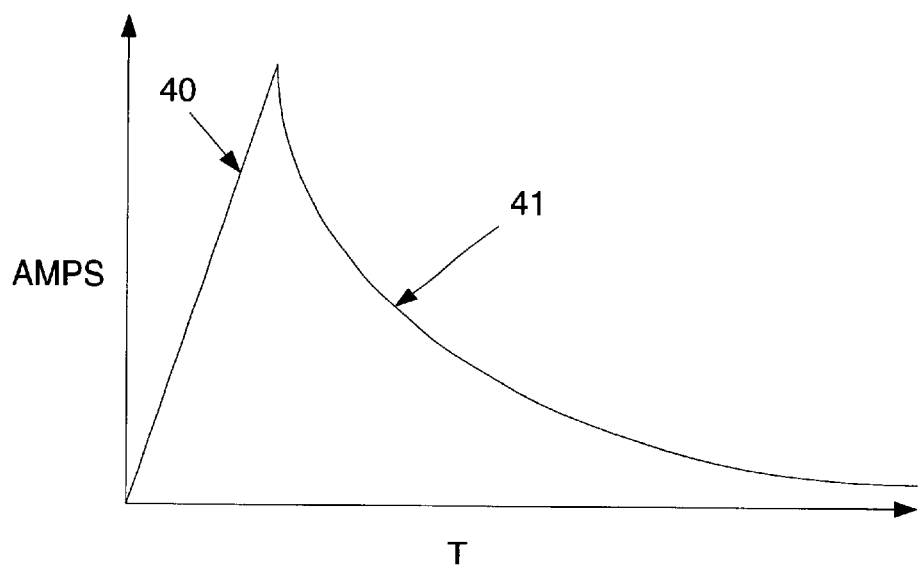
FIG. 4 illustrates the relationship between current and time during electrophoretic plating.

FIG. 4 shows an example of the relationship of current vs. time in an electrophoretic plating process. The current initially increases (indicator 40) until a thin film begins to form on the surface of the exposed connection thereby insulating the surface and restricting current flow (indicator 41) until a film of uniform thickness covers the exposed connection. Thin film thickness uniformity is achieved since the current flow to a given area (and hence the amount of material being plated onto the given area) is dependent on the thickness of the layer formed on the given surface. As a result, the electrophoresis process continues on all areas until a given thickness is attained at which time the electrophoresis process ends since current flow will be restricted. The time it takes to coat the exposed connection surface is dependent on the voltage difference between $V_1$ and $V_2$. Increasing voltage difference will result in a faster coating time.

In one embodiment, the coated conductive connection is heated or cured to harden the thin film to increase film reliability. In accordance with this embodiment, when the thin film is cured, it tends to thin at edges and points of the surface of the film thereby creating non-uniformity in the thickness of the film. Hence, in another embodiment a second film coating is applied over the first coating by performing essentially the same method as shown in FIG. 3B. Specifically, a first voltage, $V_1$, is established on the connection and the coated connection is immersed in an electrophoretic solution in contact with a third voltage, $V_3$ (where $V_3$ is greater than or equal to $V_2$). Due to the electrophoretic plating process, the coating material in the solution is more attracted to the thin areas than the thick areas of the first coating such that the composite thickness of the first and second coats results in a uniformly thick film over the exposed connection.

In one embodiment the electrophoretic solution comprises an organic resin and de-ionized median, such as water. In another embodiment, the organic resin is a polymer. In another embodiment, the exposed connection is a conductive surface comprising at least one of copper, aluminum, and gold.

It should be understood that electrophoresis is a well documented process whereby electrically charged particles in a conductive medium will migrate to the electrode bearing the opposite charge under the influence of a D.C. voltage.

Figure 5:
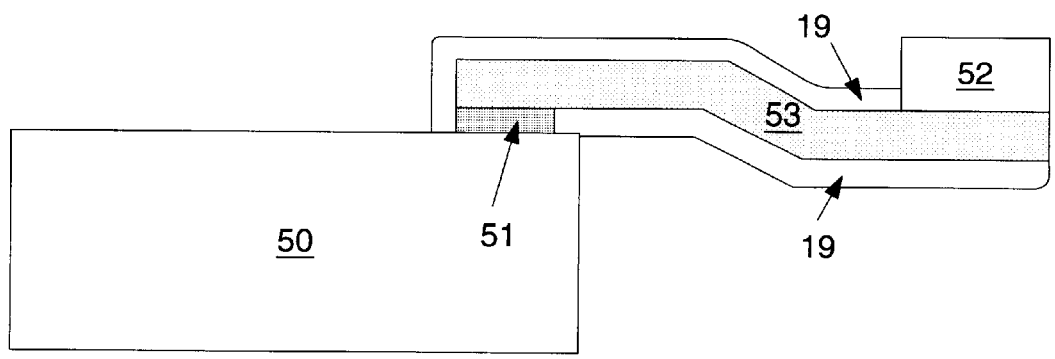
FIG. 5 illustrates a general structure including a device, a flexible tape circuit, and the exposed connection area between the device and the circuit having protective coating applied according to the method of the present invention.

A generalized embodiment of the method of the present invention results in the structure shown in FIG. 5. In particular, according to a second embodiment of the present invention, a first device 50 is connected to a flex circuit 52 via an exposed electrically conductive connection including at least a bonding pad 51, a bonding beam 53, and a conductive trace (not shown) on the flex circuit 52. The exposed connection is electrophoretically plated with a thin film 19 of uniform thickness by establishing the exposed conductive connection at a first voltage and immersing it into an electrophoretic solution in contact with an electrode at a second voltage potential thereby establishing a current between the electrode and the exposed connection such that the exposed connection is coated with the thin film.

Hence, a method, and structure formed thereof, is described for protecting an exposed conductive connection between a flex circuit and a device. The advantage of such a coating process over prior art methods of processing connections between a flex circuit and an inkjet print head device is that it provides a uniformly thick layer of protective coating to all exposed areas regardless of surface irregularities. Any pin holes or cracks occurring during the process of the present invention attracts more local current and are consequently sealed. Hence, the protective coating has no gaps, holes or cracks. A single coating process is used to protect different types of surfaces of the exposed connection area thereby reducing processing steps. Furthermore, potential gaps occurring between different protective coating regions or area are eliminated by performing a single consolidated coating process.

In the preceding description, numerous specific details are set forth, such as conductive connection and coating material types in order to provide a thorough understanding of the present invention. It will be apparent, however, to one skilled in the art that these specific details need not be employed to practice the present invention. In other instances, well-known processing steps have not been described in detail in order to avoid unnecessarily obscuring the present invention.

In addition, although elements of the present invention have been described in conjunction with certain embodiments, it is appreciated that the invention can be implement in a variety of other ways. Consequently, it is to be understood that the particular embodiments shown and described by way of illustration are in no way intended to be considered limiting. Reference to the details of these embodiments is not intended to limit the scope of the claims which themselves recited only those features regarded as essential to the invention.

I claim:

1. A method of processing comprising:
    protecting an electrically conductive exposed connection between an electrical circuit device and a flexible tape circuit from a corrosive environment using electrophoretic plating, the exposed connection being characterized as having irregular and planer surfaces, the irregular and planer surfaces being coated with a thin insulating film of uniform thickness, by:
        establishing a first voltage potential on the exposed connection; and
        immersing at least the exposed connection of the electrical circuit device in an electrophoretic solution in contact with an electrode at a second voltage potential, where the first voltage potential does not equal the second voltage potential, thereby establishing a current between the electrode and the exposed connection such that the exposed connection is coated.

2. The method of processing as described in claim 1 wherein the exposed connection is composed of at least one of copper, aluminum, and gold.

3. The method of processing as described in claim 1 such that establishing comprises coupling the exposed connection to the first voltage potential.

4. The method of processing as described in claim 1 such that establishing comprises leaving the exposed connection decoupled such that the exposed connection is established at a ground potential.

5. The method of processing as described in claim 1 wherein the electrophoretic solution comprises an organic resin and a de-ionized median.

6. The method of processing as described in claim 5 wherein the organic resin is a polymer.

7. The method of processing as described in claim 1 further comprising the step of curing the film.

8. The method of processing as described in claim 7 further comprising the step of electrophoretically plating a second film onto the first cured film wherein the composite thickness of the first and second films is of a uniform thickness.

9. The method of processing as described in claim 1 wherein the device is a thermal inkjet device including at least a substrate having an orifice plate formed thereon and at least one heating element in electrical connection with a bonding pad located on the surface of the substrate.

10. The method of processing as described in claim 9 wherein the exposed connection includes a conductive trace on the flexible tape circuit, the bonding pad on the first device, and a bonding beam between the traces and the pad.

11. The method of processing as described in claim 1 wherein the uniform thickness of the film is dependent on the differential voltage between the first and second voltage potentials.

* * * * *